(12) United States Patent
Maki et al.

(10) Patent No.: US 11,581,455 B2
(45) Date of Patent: Feb. 14, 2023

(54) SOLAR CELL MODULE MANUFACTURING METHOD AND SOLAR CELL MODULE

(71) Applicant: PANASONIC CORPORATION, Osaka (JP)

(72) Inventors: Kenichi Maki, Osaka (JP); Haruhisa Hashimoto, Osaka (JP); Naoto Imada, Osaka (JP)

(73) Assignee: PANASONIC HOLDINGS CORPORATION, Osaka (JP)

( * ) Notice: Subject to any disclaimer, the term of this patent is extended or adjusted under 35 U.S.C. 154(b) by 0 days.

(21) Appl. No.: 17/280,783

(22) PCT Filed: Aug. 23, 2019

(86) PCT No.: PCT/JP2019/033006
§ 371 (c)(1),
(2) Date: Mar. 26, 2021

(87) PCT Pub. No.: WO2020/066395
PCT Pub. Date: Apr. 2, 2020

(65) Prior Publication Data
US 2022/0005969 A1    Jan. 6, 2022

(30) Foreign Application Priority Data

Sep. 28, 2018   (JP) .............................. JP2018-185513

(51) Int. Cl.
*H01L 31/18*      (2006.01)
*H01L 31/05*      (2014.01)

(52) U.S. Cl.
CPC ...... *H01L 31/1876* (2013.01); *H01L 31/0504* (2013.01)

(58) Field of Classification Search
CPC ............... H01L 31/042; H01L 31/0504; H01L 31/18; H01L 31/1876
See application file for complete search history.

(56) References Cited

U.S. PATENT DOCUMENTS

| 5,158,618 A | 10/1992 | Rubin et al. |
| 10,483,421 B2 | 11/2019 | Kim et al. |

(Continued)

FOREIGN PATENT DOCUMENTS

| JP | 2007-235113 A | 9/2007 |
| JP | 2012-146895 A | 8/2012 |

(Continued)

OTHER PUBLICATIONS

International Search Report issued in corresponding International Patent Application No. PCT/JP2019/033006, dated Nov. 12, 2019, with English translation.

(Continued)

*Primary Examiner* — Mayla Gonzalez Ramos
(74) *Attorney, Agent, or Firm* — McDermott Will & Emery LLP

(57) ABSTRACT

First, first cell wiring members from the first solar cell and second cell wiring members from the second solar cell are sandwiched between a wiring member film and a second bridge wiring member. Subsequently, the first cell wiring members and the second cell wiring members are connected to the second bridge wiring member by applying heat to at least the first cell wiring members, the second cell wiring members, and the second bridge wiring member by induction heating.

5 Claims, 8 Drawing Sheets

(56) References Cited

U.S. PATENT DOCUMENTS

| | | | |
|---|---|---|---|
| 2005/0241692 A1 | 11/2005 | Rubin et al. | |
| 2015/0372177 A1 | 12/2015 | Kim et al. | |
| 2016/0308082 A1* | 10/2016 | Ishii | H02S 40/34 |
| 2017/0092790 A1* | 3/2017 | Harder | H01L 31/022425 |
| 2018/0062016 A1* | 3/2018 | Hyun | H01L 31/1804 |
| 2019/0207045 A1* | 7/2019 | Nakamura | H01L 31/0475 |

FOREIGN PATENT DOCUMENTS

| | | |
|---|---|---|
| JP | 2013-237059 A | 11/2013 |
| JP | 2016-005002 A | 1/2016 |
| WO | 2013/175393 A2 | 11/2013 |
| WO | 2015098203 A1 | 7/2015 |
| WO | 2017/021289 A1 | 2/2017 |
| WO | 2018051658 A1 | 3/2018 |

OTHER PUBLICATIONS

Extended European Search Report issued in corresponding European Patent Application No. 19864934.5, dated Nov. 17, 2021.
Af series monocrystalline silicon photovoltaic modules, available at http://web.archive.org/web/20180722191513/http:/www.js-ge.cn/product.asp?Product_ID=321&classid=69, saved on Jul. 22, 2018.
Non-Final Office Action issued in U.S. Appl. No. 16/560,872, dated Jun. 27, 2022.

\* cited by examiner

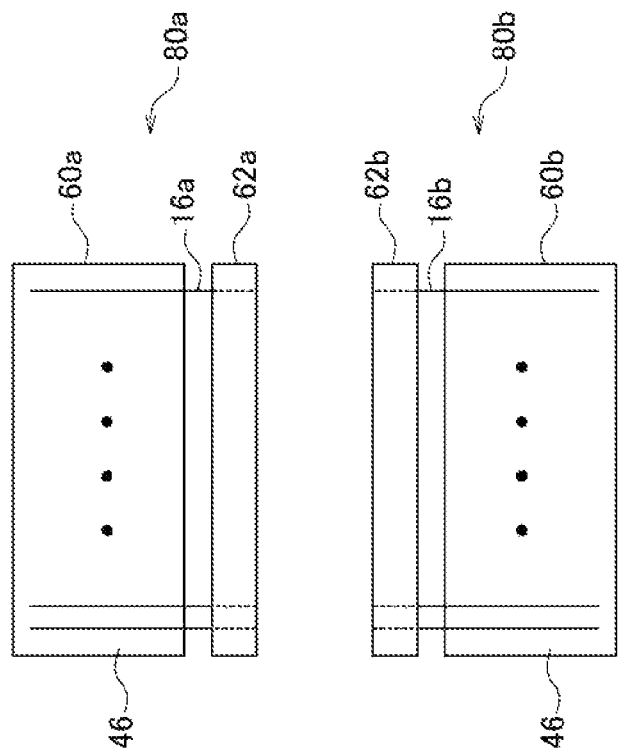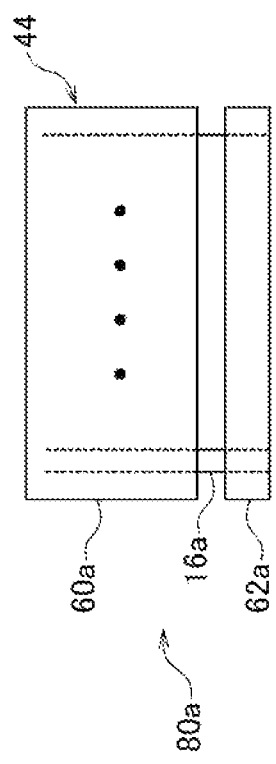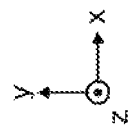

SOLAR CELL MODULE MANUFACTURING METHOD AND SOLAR CELL MODULE

CROSS-REFERENCE OF RELATED APPLICATIONS

This application is the U.S. National Phase under 35 U.S.C. § 371 of International Patent Application No. PCT/JP2019/033006, filed on Aug. 23, 2019, which in turn claims the benefit of Japanese Patent Application No. 2018-185513, filed on Sep. 28, 2018, the entire disclosures of which Applications are incorporated by reference herein.

TECHNICAL FIELD

The present invention relates to manufacturing technology and, more particularly, to a method of manufacturing a solar cell module including a plurality of solar cells and to a solar cell module.

BACKGROUND ART

A solar cell module includes a plurality of solar cells. A solar cell is available as a cell of a standard size (156 mm×156 mm) and a half-cut cell of a size (156 mm×78 mm) half the standard size. When a half-cut cell is used, a plurality of solar cells are grouped into, for example, two sections, and three solar cell strings are included in each section. Further, the two sections are connected in parallel by being connected to a bridge wiring member at the central portion (see, for example, non patent literature 1).
[Non Patent Literature 1]
[online], Internet<http://www.js-ge.cn/product.asp?Product_ID=321&classid=69>

SUMMARY OF INVENTION

Technical Problem

A wire film configured by connecting two transparent members by a plurality of wires may be used to simplify the manufacturing of a solar cell module. In the case a wire film is used in a solar cell module, the two transparent members are adhesively attached to adjacent solar cells respectively, and the wires are used as wiring members. There are cases in which the transparent member is pasted to the bridge wiring member by heating the transparent member in order to connect the plurality of wires extending from the solar cell provided at the end of a solar cell string to the bridge wiring member. If the transparent member is heated, however, the transparent member is damaged by the heat, and improper connection results.

The disclosure addresses the above-described issue, and a general purpose thereof is to provide a technology of ensuring proper connection between a solar cell and a bridge wiring member.

Solution to Problem

A method of manufacturing a solar cell module according to an embodiment of the present disclosure is adapted for a solar cell module including: a bridge wiring member that extends in a first direction; a first solar cell string that extends, of a first region and a second region separated and interfaced by the bridge wiring member, in the first region and in a second direction different from the first direction; and a second solar cell string that extends in the second region and in the second direction. The first solar cell string includes a first solar cell provided on a side of the bridge wiring member. The second solar cell string includes a second solar cell provided on a side of the bridge wiring member and facing the first solar cell, sandwiching the bridge wiring member, the method comprising: attaching a plurality of first cell wiring members to the first solar cell by means of a first cell film; attaching a plurality of second cell wiring members to the second solar cell by means of a second cell film; sandwiching the plurality of first cell wiring members from the first solar cell and the plurality of second cell wiring members from the second solar cell between a wiring member film and the bridge wiring member; and connecting the plurality of first cell wiring members and the plurality of second cell wiring members to the bridge wiring member by applying heat to at least the plurality of first cell wiring members, the plurality of second cell wiring members, and the bridge wiring member by induction heating.

Another embodiment of the present disclosure relates to a solar cell module. The solar cell module includes: a bridge wiring member that extends in a first direction; a first solar cell string that extends, of a first region and a second region separated and interfaced by the bridge wiring member, in the first region and in a second direction different from the first direction; and a second solar cell string that extends in the second region and in the second direction. The bridge wiring member includes a first surface having a length in the first direction and a width in the second direction and a second surface opposite to the first surface. The first solar cell string includes a first solar cell provided on a side of the bridge wiring member. The second solar cell string includes a second solar cell provided on a side of the bridge wiring member and facing the first solar cell, sandwiching the bridge wiring member. The plurality of first cell wiring members extending from the first solar cell toward the bridge wiring member are connected to the first surface of the bridge wiring member, and the plurality of second cell wiring members extending from the second solar cell toward the bridge wiring member are connected to the second surface of the bridge wiring member.

Advantageous Effects of Invention

According to this disclosure, it is ensured that the solar cell and the bridge wiring member are connected properly.

BRIEF DESCRIPTION OF DRAWINGS

FIGS. 5A-5B are plan views showing the structure of the film used in the solar cell module of FIG. 4.

DESCRIPTION OF EMBODIMENTS

Embodiment 1

A brief summary will be given before describing the disclosure in specific details. Embodiment 1 relates to a solar cell module in which a plurality of solar cells are arranged in a matrix. An encapsulant is provided between the first protection member and the second protection member in the solar cell module. The encapsulant encapsulates a plurality of solar cell. In this process, the two adjacent solar cells are connected by a wire film. As described above, a wire film is configured as two transparent members connected by a plurality of wires, and the respective transparent members are adhesively attached to adjacent solar cells. Since the wire plays the role of a wiring member, a solar cell string is formed by connecting a plurality of solar cells arranged in a direction of extension of the wire by means of a plurality of wire films. A wire film like this is used to simplify the manufacturing of a solar cell module.

Meanwhile, a half-cut cell may be used as a solar cell, and a bridge wiring member may be provided at the central portion. In this configuration, a solar cell string is provided in each of two regions separated and interfaced by the bridge wiring member (hereinafter, the two separated regions will be referred to as "first region" and "second region", respectively), and the end of each solar cell string is connected to the bridge wiring member. To describe it more specifically, the solar cell provided at the end of the solar cell string in the first region and the solar cell provided at the end of the solar cell string in the second region face each other, sandwiching the bridge wiring member, and a plurality of wires from the respective solar cells are connected to the bridge wiring member. In such a connection, a transparent member is adhesively attached to the bridge wiring member, sandwiching the wires, in order to reinforce connection between the wires and the bridge wiring member. If heat is applied for adhesive attachment, the transparent member is damaged by the heat, and improper connection results. Also, if the transparent member is damaged by the heat, the appearance of the solar cell module will be deteriorated due to the damaged transparent member. Therefore, suppression of damage to the transparent member caused during adhesive attachment is called for.

In this embodiment, the bridge wiring member, the wires, and the transparent member are stacked in the stated order, and the transparent member is heated from above by using induction heating. Induction heating applies heat only to a metal portion and connects the bridge wiring member and the wires such that damage to the transparent member is suppressed. The terms "parallel" and "perpendicular" in the following description not only encompass completely parallel or perpendicular but also encompass off-parallel and off-perpendicular within the margin of error. The term "substantially" means identical within certain limits.

Figure 1:
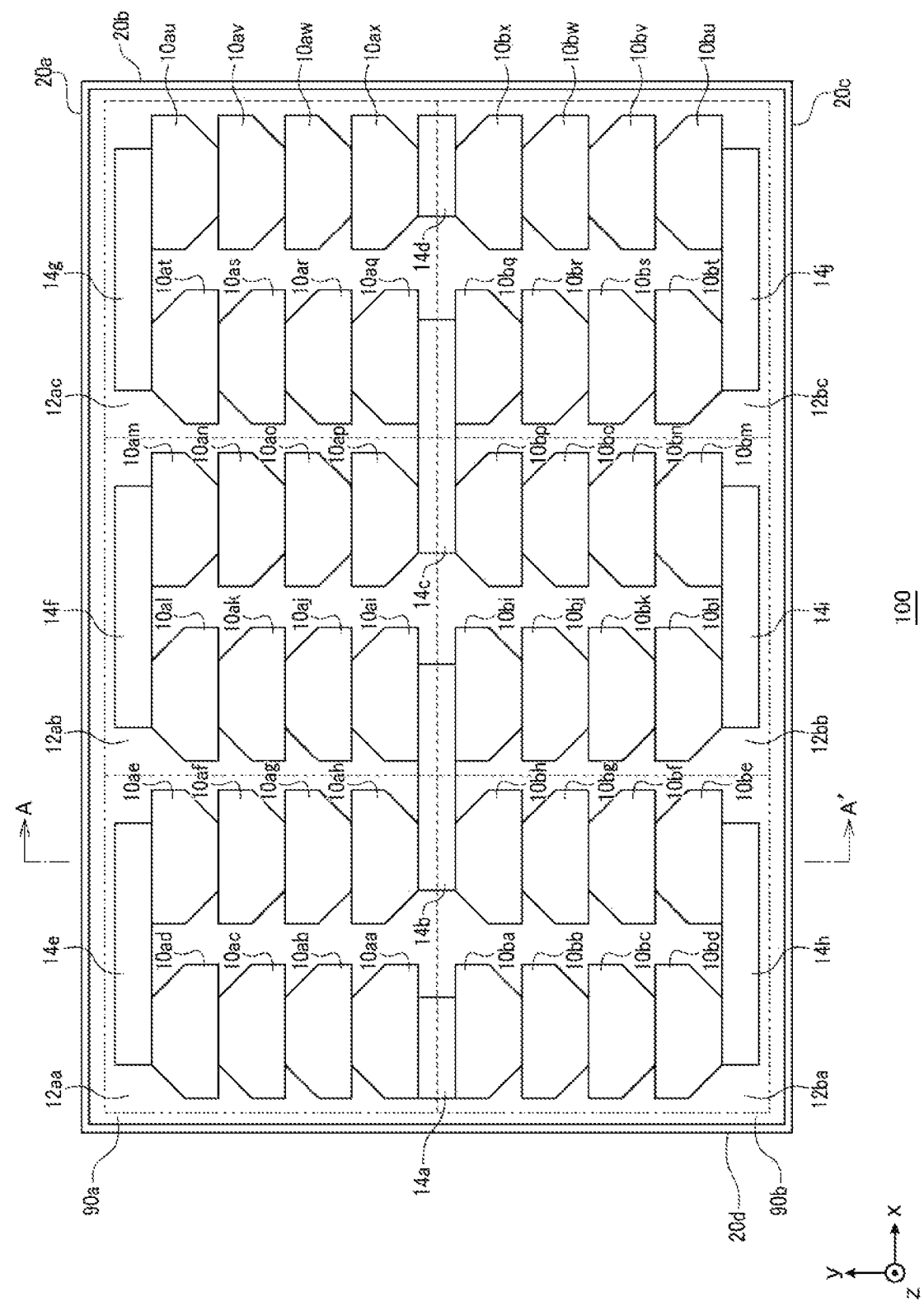
FIG. 1 is a plan view showing the structure of a solar cell module according to embodiment 1.

FIG. 1 is a plan view showing the structure of a solar cell module 100. As shown in FIG. 1, a rectangular coordinate system formed by an x axis, y axis, and z axis is defined. The x axis and y axis are orthogonal to each other in the plane of the solar cell module 100. The z axis is perpendicular to the x axis and y axis and extends in the direction of thickness of the solar cell module 100. The positive directions of the x axis, y axis, and z axis are defined in the directions of arrows in FIG. 1, and the negative directions are defined in the directions opposite to those of the arrows. Of the two principal surfaces forming the solar cell module 100 that are parallel to the x-y plane, the principal surface disposed on the positive direction side along the z axis is the light receiving surface, and the principal surface disposed on the negative direction side along the z axis is the back surface. Hereinafter, the positive direction side along the z axis will be referred to as "light receiving surface side" and the negative direction side along the z axis will be referred to as "back surface side". When the x axis direction is referred to as the "first direction", the y axis direction is referred to as the "second direction". Therefore, FIG. 1 can be said to be a plan view of the solar cell module 100 as viewed from the light receiving surface side.

The solar cell module 100 includes a 1-1st solar cell 10aa, . . . , a 1-24th solar cell 10ax, a 2-1st solar cell 10ba, . . . , a 2-24th solar cell 10bx, which are generically referred to as solar cells 10, a first bridge wiring member 14a, . . . , a tenth bridge wiring member 14j, which are generically referred to as bridge wiring members 14, a first frame 20a, a second frame 20b, a third frame 20c, and a fourth frame 20d, which are generically referred to as frames 20.

The first frame 20a extends in the x axis direction, and the second frame 20b extends in the negative direction along the y axis from the positive direction end of the first frame 20a along the x axis. Further, the third frame 20c extends in the negative direction along the x axis from the negative direction end of the second frame 20b along the y axis, and the fourth frame 20d connects the negative direction end of the third frame 20c along the x axis and the negative direction end of the first frame 20a along the x axis. The frames 20 bound the outer circumference of the solar cell module 100 and are made of a metal such as aluminum. The first frame 20a and the third frame 20c are longer than the second frame 20b and the fourth frame 20d, respectively, so that the solar cell module 100 has a rectangular shape longer in the x axis direction than in the y axis direction.

The first bridge wiring member 14a through the tenth bridge wiring member 14j extend in the x axis direction. The first bridge wiring member 14a through the fourth bridge wiring member 14d are provided on a line in the central portion of the solar cell module 100s along the y axis. A first region 90a is provided on the positive direction side along the y axis and a second region 90b is provided on the negative direction side along the y axis across a boundary defined by the first bridge wiring member 14a through the fourth bridge wiring member 14d. The first region 90a and the second region 90b each has a rectangular shape more elongated in the x axis direction than in the y axis direction. The fifth bridge wiring member 14e through the seventh bridge wiring member 14g are arranged on a line in the first region 90a toward the positive direction end of the solar cell module 100 along the y axis. Further, the eighth bridge wiring member 14h through the tenth bridge wiring member 14j are arranged on a line in the second region 90b toward the negative direction end of the solar cell module 100 along the y axis.

Each of the plurality of solar cells 10 absorbs incident light and generates photovoltaic power. In particular, the solar cell 10 generates an electromotive force from the light absorbed on the light receiving surface and also generates photovoltaic power from the light absorbed on the back surface. The solar cell 10 is formed by, for example, a semiconductor material such as crystalline silicon, gallium arsenide (GaAs), or indium phosphorus (InP). The structure of the solar cell 10 is not limited to any particular type. It is assumed that crystalline silicon and amorphous silicon are stacked by way of example. The solar cell 10 is a half-cut cell described above and has a rectangular shape more elongated in the x axis direction than in the y axis direction, but the shape of the solar cell 10 is not limited to this. A plurality of finger electrodes extending in the x axis direction in a mutually parallel manner are disposed on the light receiving surface and the back surface of each solar cell 10.

Figure 2:
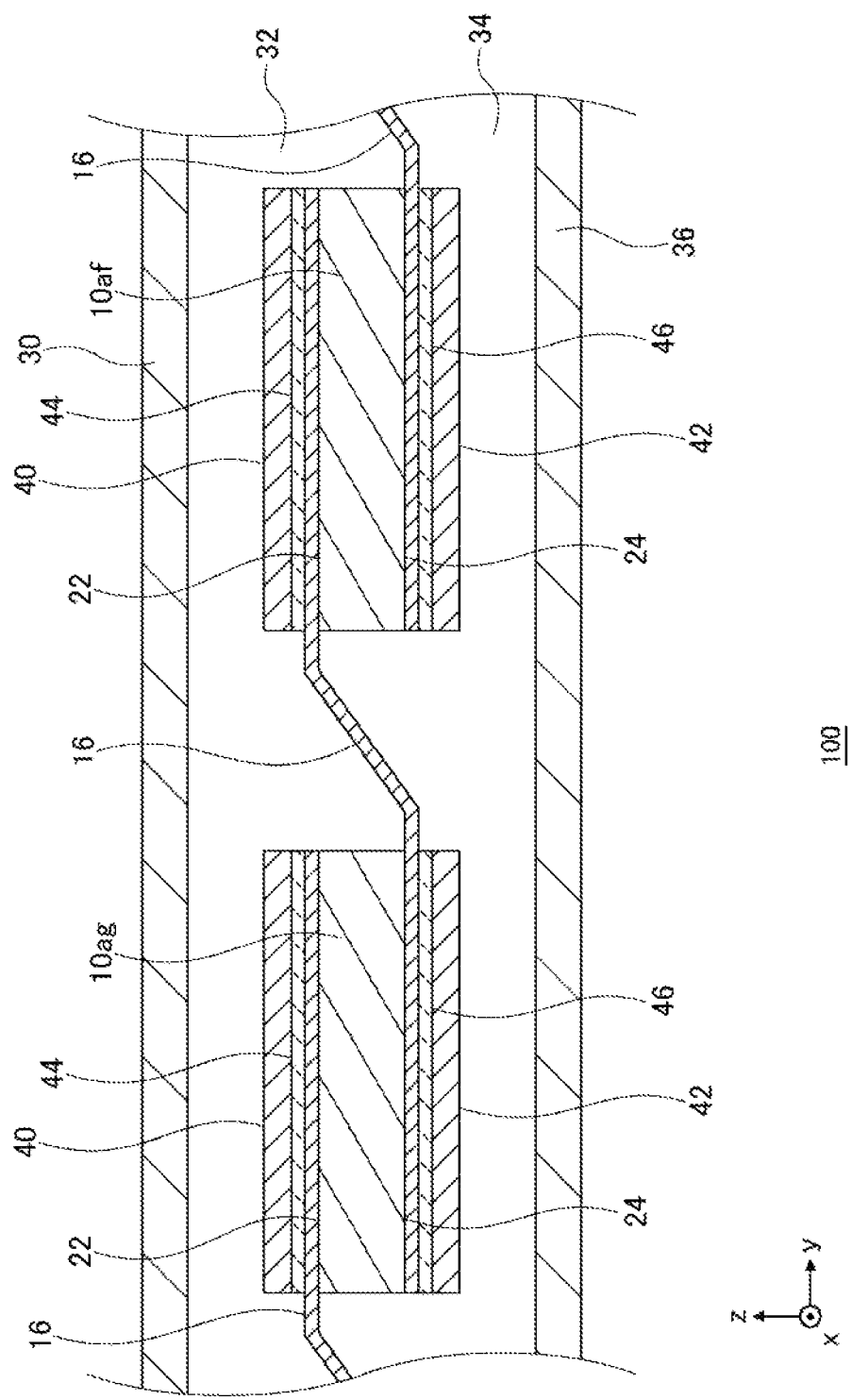
FIG. 2 is a cross sectional view showing the structure of the solar cell module of FIG. 1.

The plurality of solar cells 10 are arranged in a matrix on the x-y plane. In this case, four solar cells 10 are arranged in the y axis direction in the first region 90a. The finger electrode on the light receiving surface side of one of the two solar cells 10 adjacent to each other in the y axis direction and the finger electrode on the back surface side of the other solar cell are electrically connected by a cell wiring member (not shown). FIG. 2 is a cross sectional view showing the structure of the solar cell module 100. FIG. 2 is a cross-sectional view along the y axis and is an A-A' cross-sectional view of FIG. 1. The solar cell module 100 includes a 1-6th solar cell 10af, a 1-7th solar cell 10ag, cell wiring members 16, a first protection member 30, a first encapsulant 32, a second encapsulant 34, a second protection member 36, a light receiving surface side cell film 40, a back surface side cell film 42, a light receiving surface side adhesive 44, and a back surface side adhesive 46. The top of FIG. 2 corresponds to the light receiving surface side, and the bottom corresponds to the back surface side.

The first protection member 30 is disposed on the light receiving surface side of the solar cell module 100 and protects the surface of the solar cell module 100. Further, the solar cell module 100 is shaped in a rectangle bounded by the frames 20 on the x-y plane. The first protection member 30 is formed by using a translucent and water shielding glass, translucent plastic, etc. The first protection member 30 increases the mechanical strength of the solar cell module 100.

The first encapsulant 32 is stacked on the back surface side of the first protection member 30. The first encapsulant 32 is disposed between the first protection member 30 and the solar cell 10 and adhesively attaches the first protection member 30 and the solar cell 10. For example, a thermoplastic resin film of polyolefin, ethylene-vinyl acetate copolymer (EVA), polyvinyl butyral (PVB), polyimide, or the like may be used as the first encapsulant 32. A thermosetting resin may alternatively be used. The first encapsulant 32 is formed by a translucent sheet member having a surface of substantially the same dimension as the x-y plane in the first protection member 30.

Figure 3:
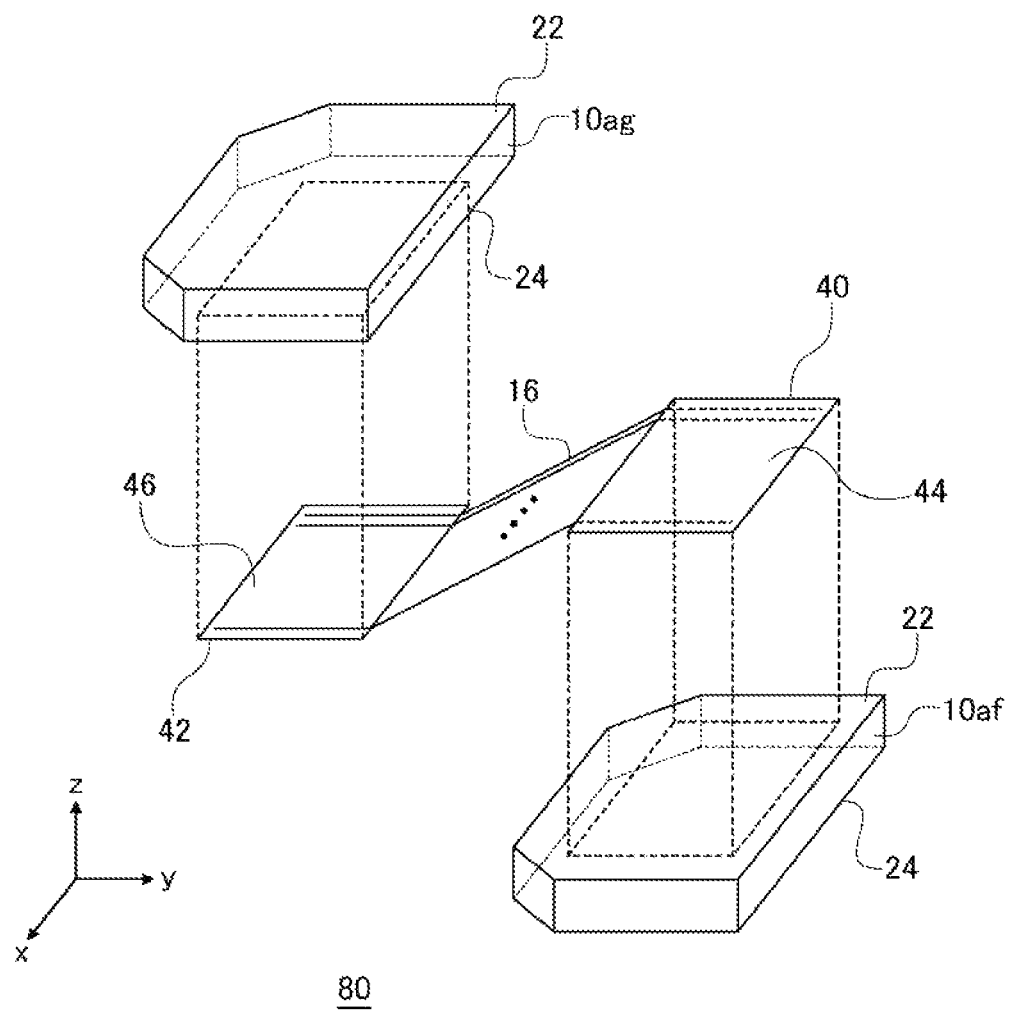
FIG. 3 is a perspective view showing the structure of a film used in the solar cell module of FIG. 2.

The 1-6th solar cell 10af and the 1-7th solar cell 10ag are stacked on the back surface side of the first protection member 30. The solar cells 10 are provided such that the light receiving surface 22 faces the positive direction side along the z axis and the back surface 24 faces the negative direction side along the z axis. When the light receiving surface 22 is referred to as the "first surface", the back surface 24 is referred to as the "second surface". The cell wiring members 16, the light receiving surface side adhesive 44, and the light receiving surface side cell film 40 are provided on the light receiving surface 22 of the solar cell 10, and the cell wiring members 16, the back surface side adhesive 46, and the back surface side cell film 42 are provided on the back surface 24 of the solar cell 10. FIG. 3 will be used to describe the above arrangement in the solar cell 10.

FIG. 3 is a perspective view showing the structure of a film 80 used in the solar cell module 100. The film 80 includes the cell wiring members 16, the light receiving surface side cell film 40, the back surface side cell film 42, the light receiving surface side adhesive 44, and the back surface side adhesive 46. The film 80 corresponds to the wire film described above, the light receiving surface side cell film 40 and the back surface side cell film 42 correspond to the transparent member described above, and the cell wiring members 16 correspond to the wires described above. The cell wiring members 16 each has a diameter of 100-500 μm, and, preferably, 300 μm, which is thinner than the width 1-2 mm of a tab wire commonly used in a solar cell module. Meanwhile, the number of cell wiring members 16 is 10-20, which is larger than the number of tab wires commonly used in a solar cell module. For example, the cell wiring members 16 extend in a cylindrical shape, and the side surface of the cylinder is coated by a solder.

The light receiving surface side cell film 40 is provided on the light receiving surface 22 side of one of the two adjacent solar cells 10, and, for example, the 1-6th solar cell 10af. The light receiving surface side cell film 40 is formed by a transparent resin film of, for example, polyethylene terephthalate (PET). The light receiving surface side cell film 40 has a rectangular shape smaller than the solar cell 10 on the x-y plane. The light receiving surface side adhesive 44 is provided on the surface of the light receiving surface side cell film 40 toward the 1-6th solar cell 10af, and the plurality of cell wiring members 16 are provided in the light receiving surface side adhesive 44. By attaching the light receiving surface side adhesive 44 on the light receiving surface 22 of the 1-6 solar cell 10af, the cell wiring members 16 are sandwiched between the light receiving surface side cell film 40 and the 1-6th solar cell 10af. For example, EVA is used for the light receiving surface side adhesive 44.

The back surface side cell film 42 is provided on the back surface 24 side of the other of the two adjacent solar cells 10, and, for example, the 1-7th solar cell 10ag. Like the light receiving surface side cell film 40, the back surface side cell film 42 is formed by a transparent resin film of, for example, PET. The back surface side cell film 42 has a rectangular shape smaller than the solar cell 10 on the x-y plane. The back surface side adhesive 46 is provided on the surface of the back surface side cell film 42 toward the 1-7th solar cell 10ag, and the plurality of cell wiring members 16 are provided in the back surface side adhesive 46. By attaching the back surface side adhesive 46 on the back surface 24 of the 1-7 solar cell 10ag, the cell wiring members 16 are sandwiched between the back surface side cell film 42 and the 1-7th solar cell 10ag. For example, EVA is used for the back surface side adhesive 46.

The film 80 configured as described above and the solar cell module 100 are manufactured separately. In manufacturing the solar cell module 100, the light receiving surface side adhesive 44 is provided on the light receiving surface 22 of the 1-6th solar cell 10af, and the back surface side adhesive 46 is provided on the back surface 24 of the 1-7th solar cell 10ag, as described above. By providing the adhesives in this way, the cell wiring members 16 electrically connects the finger electrode (not shown) on the light receiving surface 22 of the 1-6th solar cell 10af and the finger electrode (not shown) on the back surface 24 of the 1-7th solar cell 10ag. Reference is mad back to FIG. 2.

The light receiving surface side cell film 40 and the back surface side cell film 42 are equally provided in the other solar cells 10. The second encapsulant 34 is stacked on the back surface side of the first encapsulant 32. The second encapsulant 34 encapsulates the plurality of solar cells 10, the cell wiring members 16, the bridge wiring members 14, the light receiving surface side cell film 40, the back surface side cell film 42, etc., sandwiching them between the first encapsulant 32 and the second encapsulant 34. The same member as used for the first encapsulant 32 may be used for the second encapsulant 34. Alternatively, the second encapsulant 34 may be integrated with the first encapsulant 32 by heating the members in a laminate cure process.

The second protection member 36 is stacked on the back surface side of the second encapsulant 34 so as to face the first protection member 30. The second protection member 36 protects the back surface side of the solar cell module 100 as a back sheet. A resin film of, for example, PET, polytetrafluoroethylene (PTFE), etc., a stack film having a structure in which an Al foil is sandwiched by resin films of polyolefin, or the like is used as the second protection member 36. Reference is made back to FIG. 1.

As described above, the 1-1st solar cell 10aa through the 1-4th solar cell 10ad arranged in the y axis direction are connected in series by the cell wiring members 16, and the 1-5th solar cell 10ae through the 1-8th solar cell 10ah are also connected in series by the cell wiring members 16. Further, the 1-4th solar cell cell 10ad and the 1-5th solar cell 10ae are connected to the fifth bridge wiring member 14e. As a result, electrical connection between the 1-1st solar cell 10aa through the 1-4th solar cell 10ad, the fifth bridge wiring member 14e, and the 1-5th solar cell 10ae through the 1-8th solar cell 10ah forms the 1-1st solar cell string 12aa.

In the first region 90a, the 1-2nd solar cell string 12ab and the 1-3rd solar cell string 12ac are similarly formed, and the 1-1st solar cell string 12aa through the 1-3 solar cell string 12ac are arranged on a line in the x axis direction. In the second region 90b, the 2-1st solar cell string 12ba through the 2-3 solar cell string 12bc are similarly arranged on a line in the x axis direction. For example, the 2-1st solar cell string 12ab is formed by electrical connection between the 2-1st solar cell 10ba through the 2-4th solar cell 10bd, the eighth bridge wiring member 14h, and the 2-5th solar cell 10be through the 2-8th solar cell 10bh. The number of solar cells 10 included in one solar cell string 12 is not limited to "8", and the number of solar cell strings 12 is not limited to "6". In other words, the solar cell module 100 need not have a rectangular shape more elongated in the x axis direction than in the y axis direction and may have a rectangular shape less elongated in the x axis direction than in the y axis direction depending on the number of solar cells 10 included in one solar cell string 12 or the number of solar cell strings 12. Alternatively, the solar cell module 100 may have a rectangular shape having the same length in the y axis direction and in the x axis direction.

The first bridge wiring member 14a through the fourth bridge wiring member 14d electrically connect the solar cell strings 12 in the first region 90a and the solar cell strings 12 in the second region 90b. For example, the first bridge wiring member 14a connect the 1-1st solar cell 10aa of the 1-1st solar cell string 12aa and the 2-1st solar cell string 10ba of the 2-1st solar cell string 12ba. Further, the second bridge wiring member 14b connects the 1-8th solar cell 10ah of the 1-1st solar cell string 12aa and the 1-9th solar cell 10ai of the 1-2nd solar cell string 12ab in the first region 90a. Still further, the second bridge wiring member 14b connects the 2-8th solar cell 10bh of the 2-1st solar cell string 12ba and the 2-9th solar cell 10bi of the 2-2nd solar cell string 12bb in the second region 90b.

The 1-8th solar cell 10ah and the 1-9th solar cell 10ai are respectively provided on the side of the 1-1st solar cell string 12aa and the 1-2 solar cell string 12ab toward the second bridge wiring member 14b, Further, 2-8th solar cell 10bh and the 2-9th solar cell 10bi are respectively provided on the side of the 2-1st solar cell string 12ba and the 2-2 solar cell string 12bb toward the second bridge wiring member 14b, Still further, the 1-8th solar cell 10ah and the 2-8th solar cell 10bh face each other, sandwiching the second bridge wiring member 14b, and the 1-9th solar cell 10ai and the 2-9th solar cell 10bi also face each other, sandwiching the second bridge wiring member 14b. Similar connections are established in the third bridge wiring member 14c and the fourth bridge wiring member 14d.

This connects the 1-1st solar cell string 12aa, the 1-2nd solar cell string 12ab, and the 1-3rd solar string 12ac in series. The connection may be referred to as "fist section". The 2-1st solar cell string 12ba, the 2-2nd solar cell string 12bb, and the 2-3rd solar string 12bc are also connected in series. The connection may be referred to as "second section". Further, the first section and the second section are connected in parallel. A lead wiring member (not shown) is connected to the first bridge wiring member 14a and the fourth bridge wiring member 14d. The lead wiring member is a wiring member for retrieving the electric power generated in the plurality of solar cells 10 outside the solar cell module 100.

Figure 4:
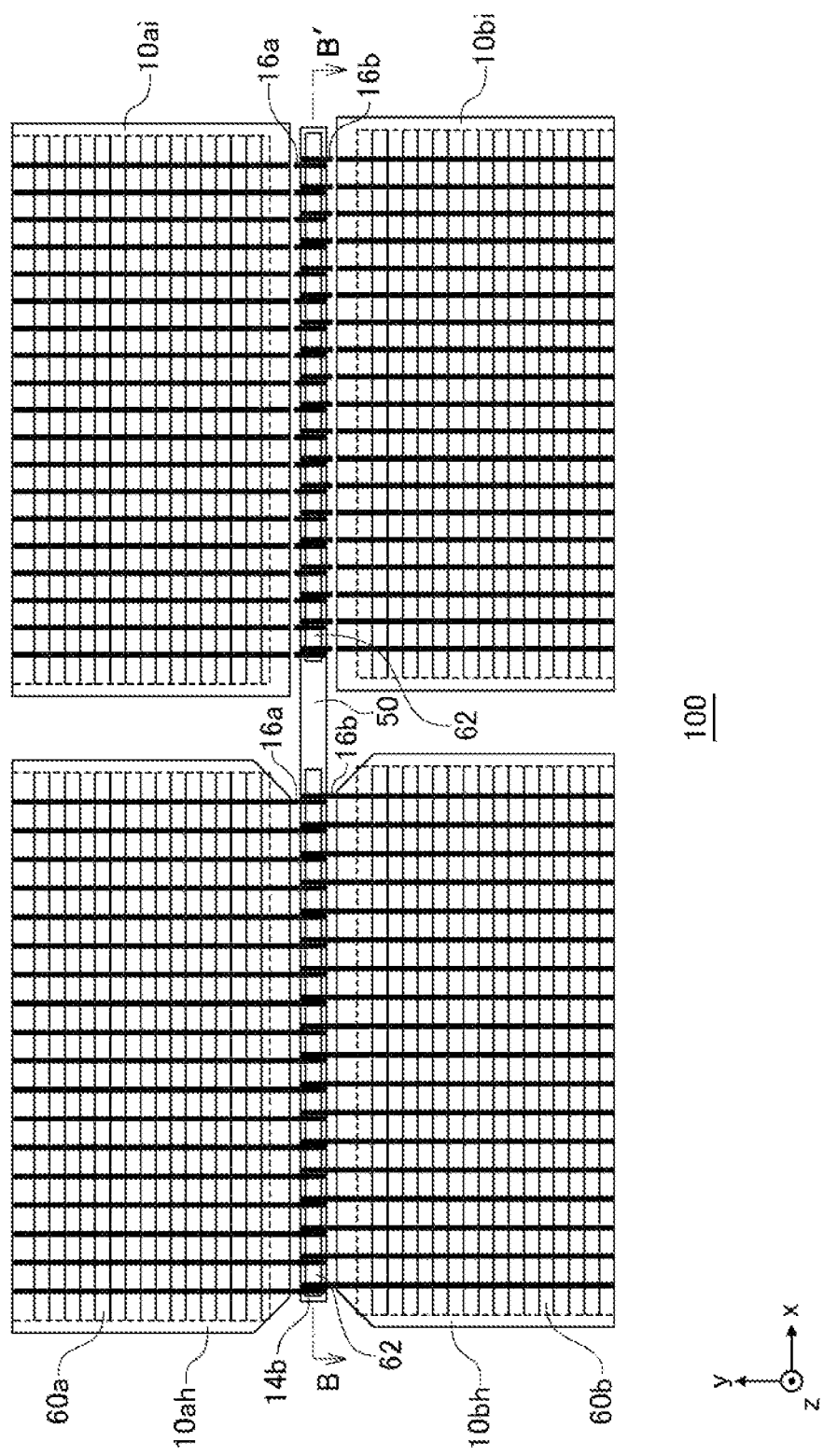
FIG. 4 is an enlarged plan view showing the structure of a portion of the solar cell module of FIG. 1.

FIG. 4 is an enlarged plan view showing the structure of a portion of the solar cell module 100. The figure shows a portion of the 1-8th solar cell 10ah, the 1-9th solar cell 10ai, the 2-8th solar cell 10bh, the 2-9th solar cell 10bi, and the second bridge wiring member 14b of FIG. 1. A rectangular surface 50 having a length in the x axis direction and a width in the y axis direction is provided on the light receiving surface side of the second bridge wiring member 14b.

The light receiving surface side cell film 40 attached to the 1-8th solar cell 10ah is referred to as a first cell film 60a, and the cell wiring members 16 provided in the first cell film 60a are referred to as first cell wiring members 16a. Therefore, the plurality of first cell wiring members 16a are connected to the 1-8th solar cell 10ah by the first cell film 60a and extend from the 1-8th solar cell 10ah toward the second bridge wiring member 14b. Further, the light receiving surface side cell film 40 attached to the 2-8th solar cell 10bh is referred to as a second cell film 60b, and the cell wiring members 16 provided in the second cell film 60b are referred to as to as the second cell wiring members 16b. Therefore, the plurality of second cell wiring members 16b are connected to the 2-8th solar cell 10bh by the second cell film 60b and extend from the 2-8th solar cell 10bh toward the second bridge wiring member 14b.

Each of the plurality of first cell wiring members 16a extends on the surface 50 of the second bridge wiring member 14b toward the end facing the 2-8th solar cell 10bh. Each of the plurality of second cell wiring members 16b extends on the surface 50 of the second bridge wiring member 14b toward the end facing the 1-8th solar cell 10ah. Each of the plurality of first cell wiring member 16a and each of the plurality of second cell wiring members 16b are arranged on the surface 50 such that they are displaced from each other in the x axis direction and mutually overlap in the y axis direction. In other words, the plurality of first cell wiring members 16a and the plurality of second cell wiring members 16b are in mesh with each other in a comb tooth pattern on the surface 50 of the second bridge wiring member 14b.

Further, a wiring member film 62 is provided on the surface 50 of the second bridge wiring member 14b so as to cover the plurality of first cell wiring members 16a and the plurality of second cell wiring members 16b. The wiring member film 62 will be described later. In other words, the plurality of first cell wiring members 16a and the plurality of second cell wiring members 16b are provided between the surface 50 of the second bridge wiring member 14b and the wiring member film 62. It can be said that the plurality of first cell wiring member 16a and the plurality of second cell wiring members 16b are connected to the second bridge wiring member 14b by the wiring member film 62.

The back surface side cell film 42 (not shown) is adhesively attached to the back surface side of the 1-9th solar cell 10ai, and the cell wiring members 16 are sandwiched between the 1-9th solar cell 10ai and the back surface side cell film 42. The back surface side cell film 42 adhesively attached to the 1-9th solar cell 10ai is also referred to as the first cell film 60a, and the cell wiring members 16 provided in the first cell film 60a are also referred to as the first cell wiring members 16a. Therefore, the plurality of first cell wiring members 16a are connected to the 1-9th solar cell 10ai by the first cell film 60a and extend from the 1-9th solar cell 10ai toward the second bridge wiring member 14b.

The back surface side cell film 42 (not shown) is also adhesively attached to the back surface side of the 2-9th solar cell 10bi, and the cell wiring members 16 are sandwiched between the 2-9th solar cell 10bi and the back surface side cell film 42. The back surface side cell film 42 adhesively attached to the 2-9th solar cell 10bi is also referred to as the second cell film 60b, and the cell wiring members 16 provided in the second cell film 60b are also referred to as the second cell wiring members 16b. Therefore, the plurality of second cell wiring members 16b are connected to the 2-9th solar cell 10bi by the second cell film 60b and extend from the 2-9th solar cell 10bi toward the second bridge wiring member 14b.

Each of the plurality of first cell wiring members 16a extends from the back surface side to the light receiving surface side and extends on the surface 50 of the second bridge wiring member 14b toward the end facing the 2-9th solar cell 10bi. Each of the plurality of second cell wiring members 16b extends from the back surface side to the light receiving surface side and extends on the surface 50 of the second bridge wiring member 14b toward the end facing the 1-9th solar cell 10ai. The arrangement of the plurality of first cell wiring members 16a and the plurality of second cell wiring members 16b on the surface 50 and the arrangement of the wiring member film 62 on the surface of the second bridge wiring member 14b are as described above, and a description thereof is omitted. Connection like this between the cell wiring members 16 and the bridge wiring member 14 is equally established in the bridge wiring members 14 other than the second bridge wiring member 14b.

A description will now be given of a method of manufacturing the solar cell module 100.

(1) The film 80 shown in FIG. 3 is prepared to connect two adjacent solar cells 10. The solar cell string 12 is produced by layering the light receiving surface side cell film 40 of the film 80 on one of the two adjacent solar cells 10 and layering the back surface side cell film 42 of the film 80 on the other of the two adjacent solar cells 10.

(2) The film 80 is prepared to connect the solar cell 10 provided at the end of the solar cell string 12 to the bridge wiring member 14. FIGS. 5A-5B are plan views showing the structure of the film 80 used in the solar cell module 100. FIG. 5A shows a first film 80a that should be adhesively attached to the 1-8th solar cell 10ah of FIG. 4 and a second film 80b that should be adhesively attached to the 2-8th solar cell 10bh. The first cell film 60a is provided toward the first end of the plurality of first cell wiring members 16a in the first film 80a, and the first wiring member film 62a is provided toward the second end opposite to the first end. The first wiring member film 62a has a size different from that of the light receiving surface side cell film 40 but is configured in a manner similar to the light receiving surface side cell film 40. The light receiving surface side adhesive 44 and the plurality of first cell wiring members 16a are provided on the back surface side of the first cell film 60a, and an adhesive (not shown) and the plurality of first cell wiring members 16a are provided on the back surface side of the first wiring member film 62a.

The second cell film 60b is provided toward the first end of the plurality of second cell wiring members 16b in the second film 80b, and the second wiring member film 62b is provided toward the second end opposite to the first end. The second wiring member film 62b is configured in a manner similar to the first wiring member film 62a. The light receiving surface side adhesive 44 and the plurality of second cell wiring members 16b are provided on the back surface side of the second cell film 60b, and an adhesive (not shown) and the plurality of second cell wiring members 16b are provided on the back surface side of the second wiring member film 62b. One of the first wiring member film 62a and the second wiring member film 62b is removed. It is assumed here that the first wiring member film 62a is maintained. The first wiring member film 62a maintained corresponds to the wiring member film 62 of FIG. 4.

FIG. 5B shows the first film 80a that should be adhesively attached to the 1-9th solar cell 10ai of FIG. 4 and the second film 80b that should be adhesively attached to the 2-9th solar cell 10bi. The first cell film 60a is provided toward the first end of the plurality of first cell wiring members 16a in the first film 80a, and the first wiring member film 62a is provided toward the second end opposite to the first end. The back surface side adhesive 46 and the plurality of first cell wiring members 16a are provided on the light receiving surface side of the first cell film 60a, and an adhesive (not shown) and the plurality of first cell wiring members 16a are provided on the back surface side of the first wiring member film 62a.

The second cell film 60b is provided toward the first end of the plurality of second cell wiring members 16b in the second film 80b, and the second wiring member film 62b is provided toward the second end opposite to the first end. The back surface side adhesive 46 and the plurality of second cell wiring members 16b are provided on the light receiving surface side of the second cell film 60b, and an adhesive (not shown) and the plurality of second cell wiring members 16b are provided on the back surface side of the second wiring member film 62b. One of the first wiring member film 62a and the second wiring member film 62b is removed. It is also assumed here that the first wiring member film 62a is maintained. The first wiring member film 62a maintained corresponds to the wiring member film 62 of FIG. 4.

(3) By attaching the light receiving surface side adhesive 44 of the first cell film 60a of FIG. 5A to the light receiving surface 22 of the 1-8th solar cell 10ah, the first cell film 60a is attached to the 1-8th solar cell 10ah. By attaching the light receiving surface side adhesive 44 of the second cell film 60b to the light receiving surface 22 of the 2-8th solar cell 10bh, the second cell film 60b is attached to the 2-8th solar cell 10bh. By attaching the back surface side adhesive 46 of the first cell film 60a of FIG. 5B to the back surface 24 of the 1-8th solar cell 10ah, the first cell film 60a is attached to the 1-8th solar cell 10ah. By attaching the back surface side adhesive 46 of the second cell film 60b to the back surface 24 of the 2-8th solar cell 10bh, the second cell film 60b is attached to the 2-8th solar cell 10bh. A similar process is performed for the other solar cells 10. (2) and (3) may be reversed in the sequence.

(4) The second end of each of the plurality of second cell wiring members 16b of FIG. 5A is placed on the surface 50 of the second bridge wiring member 14b. In this state, the second end of each of the plurality of first cell wiring members 16a is placed on the surface 50 of the second bridge wiring member 14b such that the second end of each of the plurality of first cell wiring members 16a and the second end of each of the plurality of second cell wiring members 16b are displaced in the x axis direction and mutually overlap in the y axis direction. As a result, the wiring member film 62 covering the plurality of first cell wiring members 16a is provided on the surface 50 of the second bridge wiring member 14b such that the wiring member film 62 also covers the plurality of second cell wiring members 16b. In other words, the plurality of first cell wiring members 16a and the plurality of second cell wiring members 16b are sandwiched between the surface 50 of the second bridge wiring member 14b and one wiring member film 62. A similar process is performed for the other bridge wiring members 14.

Figure 6:
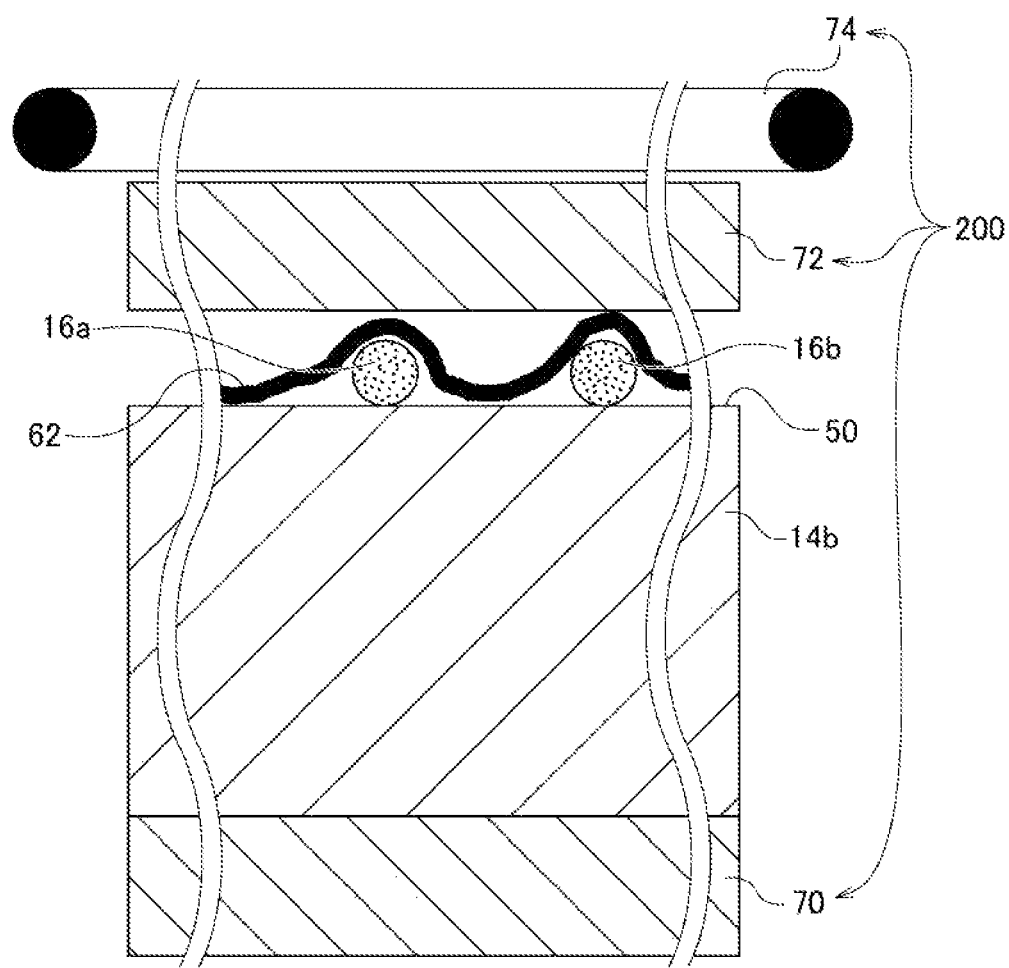
FIG. 6 is a cross sectional view showing the structure a manufacturing apparatus for manufacturing the solar cell module of FIG. 4.

(5) The portion in which the wiring member film 62, the plurality of first cell wiring members 16a, the plurality of second cell wiring members 16b, and the second bridge wiring member 14b are layered (hereinafter, referred to as "joint portion") is heated by induction heating. FIG. 6 is a cross sectional view showing the structure a manufacturing apparatus 200 for manufacturing a solar cell module. The manufacturing apparatus 200 includes a lower apparatus 70, an upper apparatus 72, and a coil 74. The lower apparatus 70 is a table to place the joint portion, and the joint portion is placed on the lower apparatus 70 with the back surface side facing down. The joint portion represents a portion in the B-B' cross section of FIG. 4. The upper apparatus 72 is placed on the light receiving surface side of the joint portion. The upper apparatus 72 is used to fix the wiring member film 62, the plurality of first cell wiring members 16a, the plurality of second cell wiring members 16b, and the second bridge wiring member 14b relative to each other in the joint portion. The upper apparatus 72 is a weight having a weight not so heavy as to disrupt the joint portion. In this state, the coil 74 is arranged to encircle the upper apparatus 72.

When an AC current is induced in the coil 74, lines of magnetic force with a varying orientation and intensity is generated around the coil 74. When the joint portion is placed near the lines of magnetic force, the substance in the joint portion that conducts electricity (e.g., metal) is affected by the varying lines of magnetic force to induce an eddy current in the metal. When an eddy current flows in the metal, Joule heat is generated due to the electrical resistance of the metal, causing the metal to generate heat. Induction heating applies heat directly to the plurality of first cell wiring members 16a, the plurality of second cell wiring members 16b, and the second bridge wiring member 14b but does not apply heat directly to the wiring member film 62. As a result, the plurality of first cell wiring members 16a and the plurality of second cell wiring members 16b are connected to the surface 50 of the second bridge wiring member 14b.

(6) A stack is produced by layering the first protection member 30, the first encapsulant 32, the solar cell string 12, the second encapsulant 34, and the second protection member 36 in the stated order in the positive-to-negative direction along the z axis.

(7) A laminate cure process performed for the stack. In this process, air is drawn from the stack, and the stack is heated and pressurized so as to be integrated. In vacuum lamination in the laminate cure process, the temperature is set to about 100-170°.

According to this embodiment, the plurality of first cell wiring members 16a and the plurality of second cell wiring members 16b are sandwiched between the wiring member film 62 and the bridge wiring member 14 and heat is applied by induction heating. It is therefore ensured that the wiring member film 62 is not directly heated. Further, since the wiring member film 62 is not directly heated, damaged to the wiring member film 62 is suppressed. Further, since damage to the wiring member film 62 is suppressed, the solar cell 10 and the bridge wiring member 14 are connected properly. Further, since damage to the wiring member film 62 is suppressed, the appearance of the solar cell module 100 is inhibited from being deteriorated. Further, since the plurality of first cell wiring members 16a and the plurality of second cell wiring members 16b are connected by the wiring member film 62 to the bridge wiring member 14, adhesion by the solder around the cell wiring members 16 and the wiring member film 62 is realized. Further, since adhesion by the solder around the cell wiring members 16 and the wiring member film 62 is realized, the strength of connection is increased. Further, since the plurality of first cell wiring members 16a and the plurality of second cell wiring members 16b are connected by the wiring member film 62 to the bridge wiring member 14, the manufacturing steps are simplified.

Further, the plurality of first cell wiring members 16a and the plurality of second cell wiring members 16b are connected to the surface 50 of the bridge wiring member 14 such that the first cell wiring members 16a and the second cell wiring members 16b overlap along the second direction. Therefore, the area of contact between the cell wiring members 16 and the bridge wiring member 14 is increased when the solar cell 10 is connected to the bridge wiring member 14. Further, since the area of contact between the cell wiring members 16 and the bridge wiring member 14 is increased, the electrical resistance is inhibited from increasing. Further, since the electrical resistance is inhibited from increasing, the electrical property of the solar cell module 100 is improved. Further, since the area of contact between the cell wiring members 16 and the bridge wiring member 14 is increased, the strength of connection is inhibited from being reduced. Further, since the strength of connection is inhibited from being reduced, the reliability of the portion of connection is improved. Further, since a wire thinner than a tab wire is used for the cell wiring members 16, the impact on the appearance of the solar cell module 100 of a displacement in the position of the cell wiring members 16 in the solar cell string 12 in the first region 90a and the solar cell string 12 in the second region 90b is reduced.

Further, since the plurality of first cell wiring members 16a are connected to the first solar cell 10 by the first cell film 60a and the plurality of second cell wiring members 16b are connected to the second solar cell 10 by the second cell film 60b, the manufacturing steps are simplified. Further, since the plurality of first cell wiring members 16a extend on the surface 50 of the bridge wiring member 14 as far as the end facing the second solar cell 10 and the plurality of second cell wiring members 16b extend on the surface of the bridge wiring member 14 as far as the end facing the first solar cell 10, the area of contact is increased.

One embodiment of the disclosure is summarized below. A method of manufacturing a solar cell module 100 according to an embodiment of the present disclosure is adapted for a solar cell module 100 including: a bridge wiring member 14 that extends in a first direction; a first solar cell string 12 that extends, of a first region 90a and a second region 90b separated and interfaced by the bridge wiring member 14, in the first region 90a and in a second direction different from the first direction; and a second solar cell string 12 that extends in the second region 90b and in the second direction. The first solar cell string 12 includes a first solar cell 10 provided on a side of the bridge wiring member 14. The second solar cell string 12 includes a second solar cell 10 provided on a side of the bridge wiring member 14 and facing the first solar cell 10, sandwiching the bridge wiring member 14, the method including: attaching a plurality of first cell wiring members 16a to the first solar cell 10 by means of a first cell film 60a; attaching a plurality of second cell wiring members 16b to the second solar cell 10 by means of a second cell film 60b; sandwiching the plurality of first cell wiring members 16a from the first solar cell 10 and the plurality of second cell wiring members 16b from the second solar cell 10 between a wiring member film 62 and the bridge wiring member 14; and connecting the plurality of first cell wiring members 16a and the plurality of second cell wiring members 16b to the bridge wiring member 14 by applying heat to at least the plurality of first cell wiring members 16a, the plurality of second cell wiring members 16b, and the bridge wiring member 14 by induction heating.

The bridge wiring member 14 may include a surface 50 having a length in the first direction and a width in the second direction. The sandwiching may include sandwiching the plurality of first cell wiring members 16a and the plurality of second cell wiring members 16b between one wiring member film 62 and the surface 50 of the bridge wiring member 14.

The sandwiching may cause the plurality of first cell wiring members 16a and the plurality of second cell wiring members 16b to mutually overlap in the second direction.

Embodiment 2

A description will now be given of embodiment 2. Like embodiment 1, embodiment 2 relates to a solar cell module in which a plurality of solar cells are arranged in a matrix, and the joint portion is connected by induction heating. In embodiment 1, the plurality of first cell wiring members 16a and the plurality of second cell wiring members 16b are provided on the surface 50 of the bridge wiring member 14. In embodiment 2, one of the plurality of first cell wiring members 16a and the plurality of second cell wiring members 16b are provided on the surface 50 on the light receiving surface side of the bridge wiring member 14 (hereinafter, "first surface"). Further, the other of the plurality of first cell wiring members 16a and the plurality of second cell wiring members 16b are provided on the surface 50 on the back surface side of the bridge wiring member 14 (hereinafter, "second surface"). The solar cell module 100 according to embodiment 2 is of the same type as that of FIG. 1 and FIG. 2, and the film 80 is of the same type as shown in FIG. 3. The following description concerns a difference from the foregoing embodiments.

Figure 7:
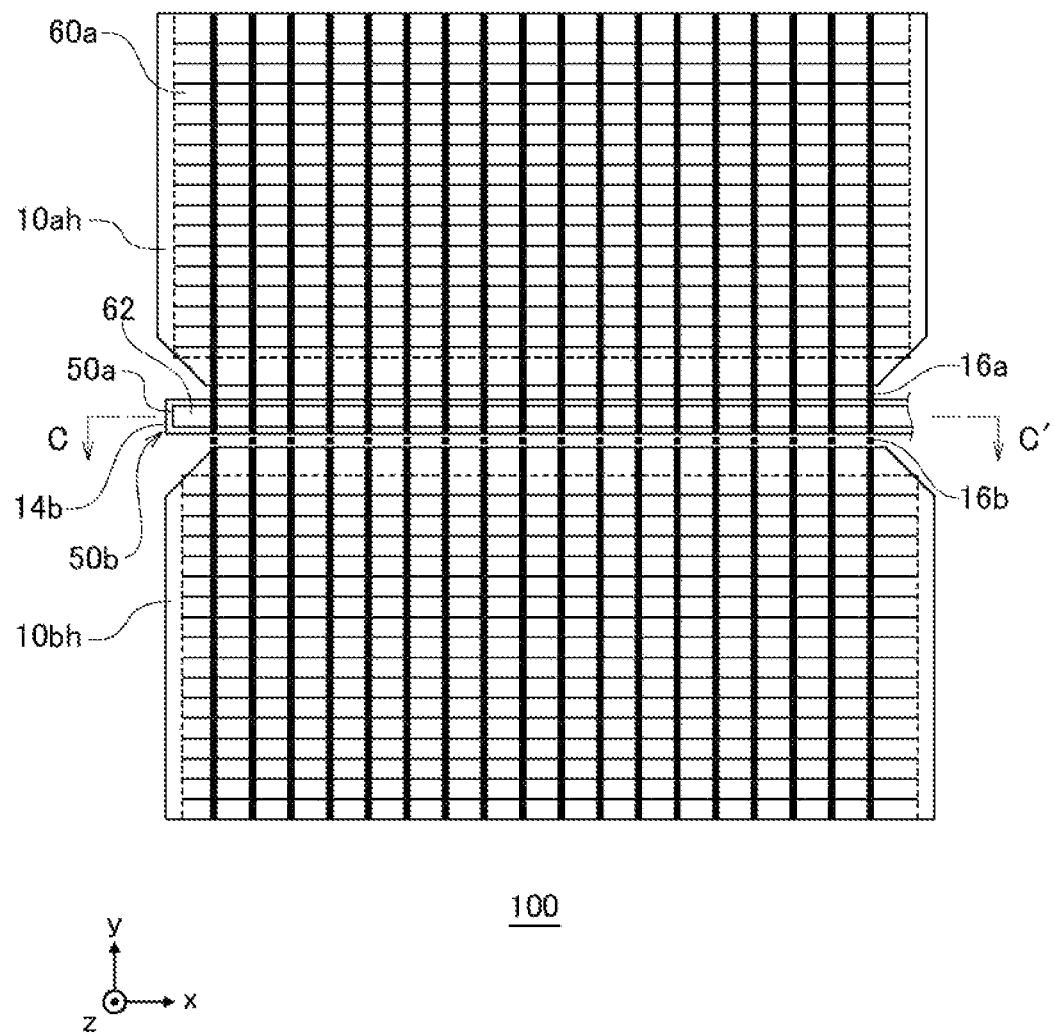
FIG. 7 is an enlarged plan view showing the structure of a portion of the solar cell module according to embodiment 2.

FIG. 7 is an enlarged plan view showing the structure of a portion of the solar cell module 100. The appearance is similar to that of FIG. 4. The second bridge wiring member 14b has a first surface 50a on the light receiving surface side, and the first surface 50a corresponds to the surface 50 discussed so far. The plurality of first cell wiring members 16a from the 1-8th solar cell 10ah extend toward the second bridge wiring member 14b and extend on the first surface 50a of the second bridge wiring member 14b as far as the end facing the 2-8th solar cell 10bh. Further, the first wiring member film 62a is provided on the first surface 50a of the second bridge wiring member 14b so as to cover the plurality of first cell wiring members 16a. The first wiring member film 62a is shown in FIG. 5A. In other words, the plurality of first cell wiring member 16a are provided between the first surface 50a of the second bridge wiring member 14b and the first wiring member film 62a. It can be said that the plurality of first cell wiring member 16a are connected to the second bridge wiring member 14b by the first wiring member film 62a.

The second bridge wiring member 14b has a second surface 50b on the back surface side opposite to the light receiving surface side. Further, the back surface side cell film 42 adhesively attached to the back surface 24 of the 2-8th solar cell 10bh is referred to as a second cell film 60b. The plurality of second cell wiring members 16b are provided between the back surface 24 of the 2-8th solar cell 10bh and the second cell film 60b. The plurality of second cell wiring members 16b extend toward the second bridge wiring member 14b and extend on the second surface 50b of the second bridge wiring member 14b as far as the end facing the 1-8th solar cell 10ah. Further, the second wiring member film 62b is provided on the second surface 50b of the second bridge wiring member 14b so as to cover the plurality of second cell wiring members 16b. The adhesive and the plurality of second cell wiring members 16b are provided on the light receiving surface side of the second wiring member film 62b. In this way, the plurality of first cell wiring members 16a and the plurality of second cell wiring members 16b are connected to different surfaces 50 of the second bridge wiring member 14b.

The arrangement of the first cell wiring members 16a between the 1-9th solar cell 10ai (not shown) and the second bridge wiring member 14b is similar to the arrangement of the second cell wiring members 16b between the 2-8th solar cell 10bh and the second bridge wiring member 14b. The arrangement of the second cell wiring members 16b between the 2-9th solar cell 10bi (not shown) and the second bridge wiring member 14b is similar to the arrangement of the first cell wiring members 16a between the 1-8th solar cell 10ah and the second bridge wiring member 14b. Connection like this between the cell wiring members 16, the bridge wiring member 14, and the wiring member film 62 is equally established in the bridge wiring members 14 other than the second bridge wiring member 14b.

A description will now be given of a method of manufacturing the solar cell module 100. A description of those steps that are identical to the steps of embodiment 1 will be omitted.

(2) The film 80 is prepared to connect the solar cell 10 provided at the end of the solar cell string 12 to the bridge wiring member 14. The configuration of the film 80 is as described above. The first wiring member film 62a and the second wiring member film 62b are both maintained.

(4) The second end of each of the plurality of first cell wiring members 16a from the 1-8th solar cell 10ah is placed on the first surface 50a of the second bridge wiring member 14b. In this state, the first wiring member film 62a covering the plurality of first cell wiring members 16a is provided on the first surface 50a of the second bridge wiring member 14b. In other words, the plurality of first cell wiring members 16a are sandwiched between the first surface 50a of the second bridge wiring member 14b and the first wiring member film 62a. The second end of each of the plurality of second cell wiring members 16b from the 2-8th solar cell 10bh is placed on the second surface 50b of the second bridge wiring member 14b. In this state, the second wiring member film 62b attached to the plurality of second cell wiring members 16b is provided on the second surface 50b of the second bridge wiring member 14b. In other words, the plurality of second cell wiring members 16b are sandwiched between the second surface 50b of the second bridge wiring member 14b and second wiring member film 62b. A similar process is performed for the other bridge wiring members 14.

Figure 8:
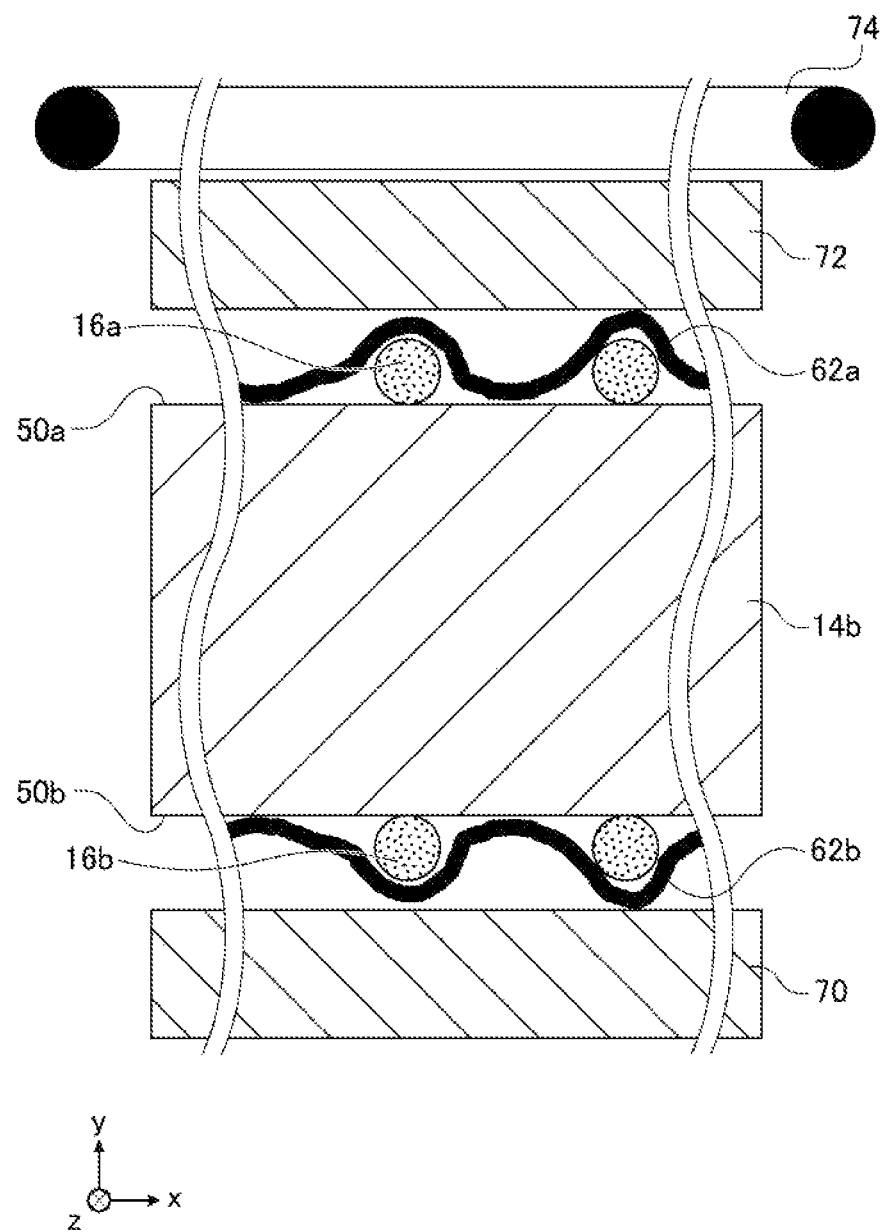
FIG. 8 is a cross sectional view showing the structure a manufacturing apparatus for manufacturing the solar cell module of FIG. 7.

(5) The portion in which the first wiring member film 62a, the plurality of first cell wiring members 16a, the second bridge wiring member 14b,s the plurality of second cell wiring members 16b, and the second wiring member film 62b are layered (hereinafter, referred to as "joint portion") is heated by induction heating. FIG. 8 is a cross sectional view showing the structure a manufacturing apparatus 200 for manufacturing the solar cell module 100. The manufacturing apparatus 200 has the same configuration as that of embodiment 1. The joint portion represents a portion in the C-C' cross section of FIG. 7. The first wiring member film 62a, the plurality of first cell wiring members 16a, the second bridge wiring member 14b, the plurality of second cell wiring members 16b, the second wiring member film 62b are layered in the stated order in a direction from the upper apparatus 72 toward the lower apparatus 70.

When an AC current is induced in the coil 74, Induction heating applies heat directly to the plurality of first cell wiring members 16a, the plurality of second cell wiring members 16b, and the second bridge wiring member 14b but does not apply heat directly to the first wiring member film 62a and the second wiring member film 62b. As a result, the plurality of first cell wiring members 16a are connected to the first surface 50a of the second bridge wiring member 14b, and plurality of second cell wiring members 16b are connected to the second surface 50b of the second bridge wiring member 14b.

According to this embodiment, the plurality of first cell wiring members 16a are sandwiched between the first wiring member film 62a and the first surface 50a, and the plurality of second cell wiring members 16b are sandwiched between the second wiring member film 62b and the second surface 50b. Accordingly, the two types of cell wiring members 16 are provided on different surfaces of the bridge wiring member 14. Further, since the two types of cell wiring members 16 are provided on different surfaces of the bridge wiring member 14, the manufacturing steps are simplified. Further, since the plurality of first cell wiring members 16a are connected to the first surface 50a of the bridge wiring member 14 and the plurality of second cell wiring members 16b are connected to the second surface 50b of the bridge wiring member 14, the manufacturing steps are simplified.

One embodiment of the disclosure is summarized below. The bridge wiring member 14 may include a first surface 50a having a length in the first direction and a width in the second direction and a second surface 50b opposite to the first surface. The sandwiching includes sandwiching the plurality of first cell wiring members 16a between the first wiring member film 62a and the first surface 50a of the bridge wiring member 14 and sandwiching plurality of second cell wiring members 16b between the second wiring member film 62b and the second surface 59b of the bridge wiring member 14.

Another embodiment of the present disclosure relates to a solar cell module 100. The solar cell module 100 includes: a bridge wiring member 14 that extends in a first direction; a first solar cell string 12 that extends, of a first region 90a and a second region 90b separated and interfaced by the bridge wiring member 14, in the first region 90a and in a second direction different from the first direction; and a second solar cell string 12 that extends in the second region 90b and in the second direction. The bridge wiring member 14 includes a first surface 50a having a length in the first direction and a width in the second direction and a second surface 50b opposite to the first surface 50a. The first solar cell string 12 includes a first solar cell 10 provided on a side of the bridge wiring member 14. The second solar cell string 12 includes a second solar cell 10 provided on a side of the bridge wiring member 14 and facing the first solar cell 10, sandwiching the bridge wiring member 14. The plurality of first cell wiring members 16a extending from the first solar cell 10 toward the bridge wiring member 14 are connected to the first surface 50a of the bridge wiring member 14, and the plurality of second cell wiring members 16b extending from the second solar cell 10 toward the bridge wiring member 14 are connected to the second surface 50b of the bridge wiring member 14.

Described above is an explanation of the present disclosure based on an exemplary embodiment. The embodiment is intended to be illustrative only and it will be understood by those skilled in the art that various modifications to constituting elements and processes could be developed and that such modifications are also within the scope of the present invention.

In embodiment 1, the plurality of first cell wiring members 16a from the 1-8th solar cell 10ah extend on the surface 50 of the second bridge wiring member 14b as far as the end facing the 2-8th solar cell 10bh. Further, the plurality of second cell wiring members 16b from the 2-8th solar cell 10bh extend on the surface 50 of the second bridge wiring member 14b as far as the end facing the 1-8th solar cell 10ah. However, the configuration is not limited to this, and each of the first cell wiring members 16a may extend on the surface 50 of the second bridge wiring member 14b as far as a point between the end facing the 1-8th solar cell 10ah and the end facing the 2-8th solar cell 10bh. Further, the second cell wiring members 16b may extend on the surface 50 of the second bridge wiring member 14b as far as a point between the end facing the 1-8th solar cell 10ah and the end facing the 2-8th solar cell 10bh. The same is true of the other cell wiring members 16. According to this variation, the flexibility in configuration can be improved.

In embodiment 1, one of the first wiring member film 62a and the second wiring member film 62b is removed. Alternatively, however, a portion of the first wiring member film 62a may be removed, and a portion of the second wiring member film 62b may be removed. The portion of the first wiring member film 62a that remains and the portion of the second wiring member film 62b that remains are combined on the surface 50 of the bridge wiring member 14 to from the wiring member film 62 of FIG. 4. According to this variation, the flexibility in configuration can be improved.

INDUSTRIAL APPLICABILITY

According to this disclosure, it is ensured that the solar cell and the bridge wiring member are connected properly.

REFERENCE SIGNS LIST 10 solar cell, 12 solar cell string, 14 bridge wiring member, 16 cell wiring member, 20 frame, 22 light receiving surface, 24 back surface, 30 first protection member, 32 first encapsulant, 34 second encapsulant, 36 second protection member, 40 light receiving surface side cell film, 42 back surface side cell film, 44 light receiving surface side adhesive, 46 back surface side adhesive, 50 surface, 60 cell film, 62 wiring member film, 70 lower apparatus, 72 upper apparatus, 74 coil, 80 film, 100 solar cell module, 200 manufacturing apparatus

The invention claimed is:

1. A method of manufacturing a solar cell module, the solar cell module including:
   a bridge wiring member that extends in a first direction, the bridge wiring member dividing the solar cell module into a first region and a second region;
   a first solar cell string that extends in the first region and in a second direction different from the first direction; and
   a second solar cell string that extends in the second region and in the second direction, wherein
   the first solar cell string includes a first solar cell provided on a side of the bridge wiring member, and
   the second solar cell string includes a second solar cell provided on a side of the bridge wiring member and facing the first solar cell, wherein the first solar cell and the second solar cell sandwich the bridge wiring member,
   the method comprising:
   preparing a first cell film having (1) a first adhesive on a surface of the first cell film, and (2) a plurality of first cell wiring members in the first adhesive;
   preparing a second cell film having (1) a second adhesive on a surface of the first cell film, and (2) a plurality of second cell wiring members in the second adhesive;
   attaching the plurality of first cell wiring members to the first solar cell by attaching the first adhesive of the first cell film to the first solar cell;
   attaching the plurality of second cell wiring members to the second solar cell by attaching the first adhesive of a second cell film to the second solar cell;
   sandwiching the plurality of first cell wiring members from the first solar cell and the plurality of second cell wiring members from the second solar cell between a wiring member film and the bridge wiring member; and
   connecting the plurality of first cell wiring members and the plurality of second cell wiring members to the bridge wiring member by applying heat to at least the plurality of first cell wiring members, the plurality of second cell wiring members, and the bridge wiring member by induction heating.

2. The method of manufacturing a solar cell module according to claim 1, wherein
   the bridge wiring member includes a surface having a length in the first direction and a width in the second direction, and
   the sandwiching includes sandwiching the plurality of first cell wiring members and the plurality of second cell wiring members between one wiring member film and the surface of the bridge wiring member.

3. The method of manufacturing a solar cell module according to claim 2, wherein the sandwiching causes the plurality of first cell wiring members and the plurality of second cell wiring members to mutually overlap in the second direction.

4. The method of manufacturing a solar cell module according to claim 1, wherein
   the bridge wiring member includes a first surface having a length in the first direction and a width in the second direction and a second surface opposite to the first surface,
   the wiring member film includes a first wiring member film and a second wiring member film, and
   the sandwiching includes sandwiching the plurality of first cell wiring members between the first wiring member film and the first surface of the bridge wiring member and sandwiching plurality of second cell wiring members between the second wiring member film and the second surface of the bridge wiring member.

5. A solar cell module comprising:
   a bridge wiring member that extends in a first direction without being bent, the bridge wiring member dividing the solar cell module into a first region and a second region;
   a first solar cell string that extends in the first region and in a second direction different from the first direction; and
   a second solar cell string that extends in the second region and in the second direction, wherein
   the bridge wiring member includes a first surface having a length in the first direction and a width in the second direction and a second surface opposite to the first surface,
   the first solar cell string includes a first solar cell provided on a side of the bridge wiring member,
   the second solar cell string includes a second solar cell provided on a side of the bridge wiring member and facing the first solar cell, wherein the first solar cell and the second solar cell sandwich the bridge wiring member, and
   the solar cell module further comprises:
      a plurality of first cell wiring members that (1) extend from the first solar cell toward the bridge wiring member, (2) extend across the first surface of the bridge wiring member in the second direction, and (3) are connected to the first surface, and
      a plurality of second cell wiring members that (1) extend from the second solar cell toward the bridge wiring member, (2) extend across the second surface of the bridge wiring member in the second direction, and (3) are connected to the second surface.

* * * * *